United States Patent [19]

Sakuma et al.

[11] Patent Number: 4,980,515

[45] Date of Patent: Dec. 25, 1990

[54] ELECTRICAL APPARATUS WITH AN IN-TANK ELECTROMAGNETIC SHIELD

[75] Inventors: Takashi Sakuma; Katsuji Sokai, both of Ako, Japan

[73] Assignee: Mitsubishi Denki Kabushiki Kaisha, Japan

[21] Appl. No.: 369,039

[22] Filed: Jun. 20, 1989

[30] Foreign Application Priority Data

Jun. 21, 1988 [JP] Japan ............................... 63-154107

[51] Int. Cl.[5] ...................... H01F 27/36; H01F 27/04; H05K 9/00

[52] U.S. Cl. .................................. 174/35 CE; 174/18

[58] Field of Search ............... 174/18, 35 CE; 336/90; 200/150 J

[56] References Cited

U.S. PATENT DOCUMENTS 4,370,512 1/1983 Thomas ................................ 174/18

FOREIGN PATENT DOCUMENTS 592759 2/1960 Canada .......................... 174/35 CE
1540113 12/1969 Fed. Rep. of Germany ... 174/35 CE
53-149623 12/1978 Japan ............................. 174/35 CE
54-9721 1/1979 Japan ............................. 174/35 CE
416564 6/1934 United Kingdom ........... 174/35 CE

*Primary Examiner*—Laramie E. Askin
*Attorney, Agent, or Firm*—Leydig, Voit & Mayer

[57] ABSTRACT

An electrical apparatus with an in-tank shield has a tank which houses an electrical device such as a transformer. A plurality of bushings extend into the tank. Inner shields having good electrical conductivity surround the inner portions of the bushings and are connected to the outer portions of the bushings. A shorting plate having a good electrical conductivity connects the inner shields to each other.

1 Claim, 7 Drawing Sheets

ELECTRICAL APPARATUS WITH AN IN-TANK ELECTROMAGNETIC SHIELD

BACKGROUND OF THE INVENTION

This invention relates to an electrical apparatus such as a high-power electrical transformer.

FIG. 1 is a sectional view illustrating a conventional three-phase transformer, as an example of an electrical apparatus used in a power plant or the like, in which reference number 1 indicates a transformer main body which comprises an iron core 101 and a winding 102. 2 indicates a tank which contains the transformer main body 1 and which is filled with an electrically insulating oil.

FIG. 2 is a front view of the upper portion of the tank 2 as viewed from the right in FIG. 1. 201 and 202 indicate high-voltage bushing mounting seats and low-voltage bushing mounting seats formed on the tank 2, respectively, and 3 indicates high-voltage bushings mounted on the high-voltage bushing mounting seats 201 and connected to a high-voltage side of the winding 102. 203 indicates bus conductor outer sheath mounting flanges formed on the low-voltage mounting seats 202, 204 indicates low-voltage bushing mounting flanges formed on the bus conductor outer sheath mounting flanges 203, and 4 indicates low-voltage bushings mounted to low-voltage bushing mounting flanges 204 and connected to the low-voltage side of the winding 102, the detail of which is shown in FIG. 3.

In FIG. 3, 401 indicates an insulator tube, 402 indicates a circular rod-shaped central conductor inserted into the insulator tube 401, 403 and 404 indicate an upper terminal and a lower terminal disposed at the opposite ends of the central conductor 402 and 405 indicates a mounting unit disposed about the outer circumference of the central portion of the insulator tube 401 and secured thereto by cement 406. By attaching the mounting unit 405 to the low-voltage bushing mounting flange 204 by bolts 5A, the low-voltage bushing 4 is mounted so that it extends into the tank 2.

As partly shown in FIG. 2, there are three of the high-voltage and low-voltage bushings 3 and 4 and their mounting seats 201 and 202 for three phases. In FIGS. 1 and 2, 6 indicates three-phase separated bus conductors connecting the low-voltage bushings 4 and a generator (not shown), 7A indicates transformer-side three-phase separated bus conductor outer sheaths surrounding the low-voltage bushings 4 at the portion located outside of the tank 2, 8A and 8B indicate outer sheath shorting plates common to three phases and disposed at the opposite ends of the transformer-side three-phase separated bus conductor outer sheaths 7A, one of the shorting plates, 8A, being mounted on the bus conductor outer sheath mounting flanges 203. 7B indicates generator-side three-phase separated bus conductor outer sheaths surrounding the three-phase separated bus conductors 6, 8C indicates an outer sheath shorting plate common to three phases and disposed at one of the ends of the generator-side three-phase separated bus conductor outer sheaths 7B, a similar outer sheath shorting plate (not shown) being provided at the other ends. 9 indicates expansion joints made of an electrically insulating material and disposed between the transformer-side and the generator-side three-phase separated outer sheaths 7A and 7B.

The operation will now be described. An electric current which flows from the unillustrated generator through the three-phase separated bus conductors 6 and the low-voltage bushings 4 flows into the winding 102 of the transformer main body 1 and is boosted and supplied to an external circuit. Since the current from the generator is large, a massive magnetic flux is generated around the three-phase separated bus conductors 6, so that a stray loss is increased and the metal of the adjacent structural members (not shown) is overheated. Therefore, a so-called mini-flux structure is adapted, in which a three-phase closed circuit is formed by the three-phase separated bus conductor outer sheaths 7B on the generator-side, the outer sheath shorting plate 8C on one of the ends of the outer sheaths and the unillustrated outer sheath shorting plate on the other ends of the outer sheaths so that the magnetic flux crosses the closed circuit and generates a current flowing in the direction opposite to the three-phase separated bus conductors 6 thereby generating a magnetic flux which offsets the magnetic flux generated by the current flowing through the three-phase separated bus conductor 6. Similarly, the transformer-side three-phase separated bus conductor outer sheaths 7A and the shorting plates 8A and 8B form a three-phase closed circuit having a mini-flux structure. Further, the expansion joint 9 absorbs the dimensional differences between both of the three-phase separated bus conductor outer sheaths 7A and 7B. An insulating material is selected for the joint to electrically isolate the generator side and the transformer side so that they do not electrically influence each other.

Since a mini-flux structure including the phase-separated bus conductors and the outer sheath shorting plates is employed on the outside of the tank, the magnetic fluxes generated by the current flowing through the phase-separated bus conductors ara cancelled out. However, since a mini-flux structure is not adapted on the inside of the tank, a massive magnetic flux is generated by the current flowing through the bushings to increase the stray loss and overheat the adjacent structural members, the tank and the like.

SUMMARY OF THE INVENTION

Accordingly, one object of the present invention is to provide an electrical apparatus free from the above-described problems of the conventional design.

Another object of the present invention is to provide an electrical apparatus in which the stray loss is small.

A further object of the present invention is to provide an electrical apparatus in which the structures around the bushing are not overheated.

An electrical apparatus of the present invention comprises an inner shield surrounding the portion of each bushing located inside of a tank. The inner shields are connected to phase-separated bus conductor outer sheaths, and are connected to each other by a shorting plate.

As a result, a mini-flux structure extends from the outside to the inside of the tank, and the magnetic flux inside of the tank due to the currents flowing through the bushings is cancelled out by the magnetic flux due to the current flowing through the inner shield.

PREFERRED EMBODIMENT OF THE INVENTION

Figure 1:
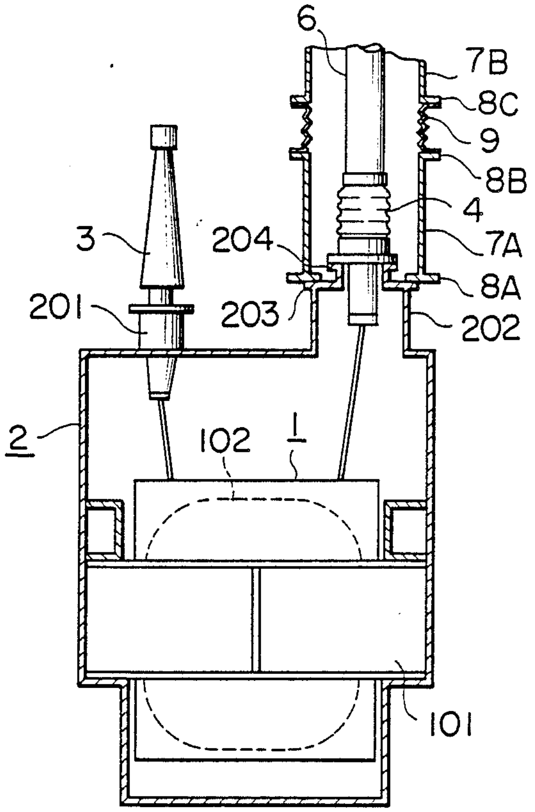
FIG. 1 PRIOR ART
FIG. 1 is a vertical cross-sectional view of a conventional transformer.
Figure 2:
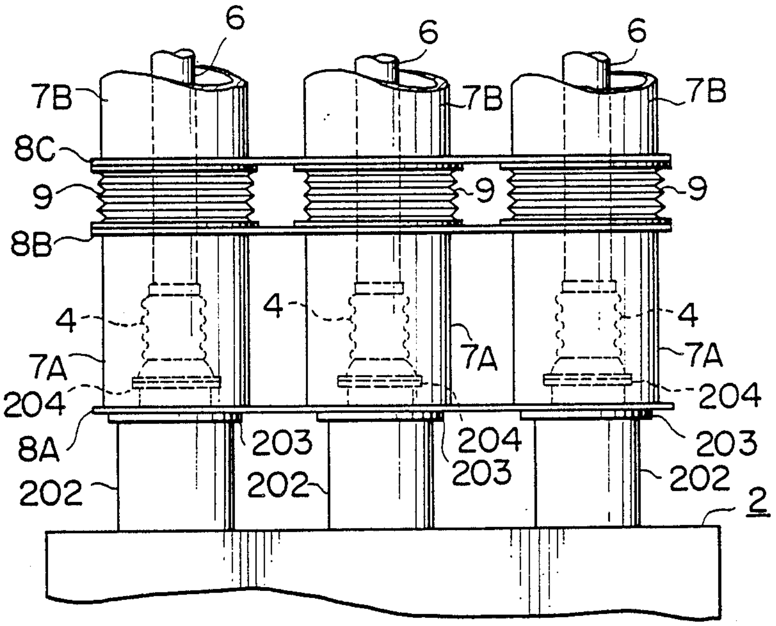
FIG. 2 PRIOR ART
FIG. 2 is a front view of the upper portion of the transformer shown in FIG. 1.
Figure 4:
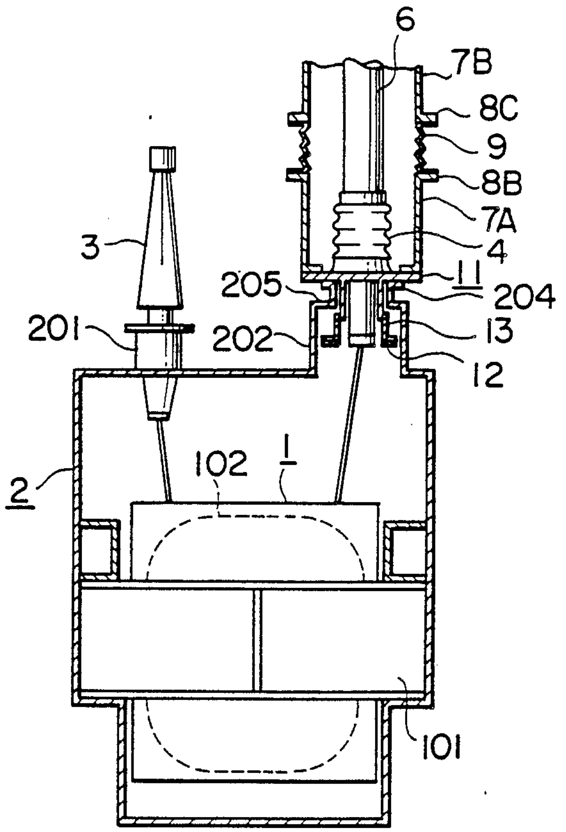
FIG. 4 is a vertical cross-sectional view of one embodiment of a transformer of the present invention.

One embodiment of the present invention will now be described in conjunction with the accompanying drawings. FIG. 4 is a vertical cross-sectional view showing an embodiment of an electrical apparatus of the present invention in the form of a transformer. The transformer main body 1, the iron core 101, the winding 102, the tank 2, the high-voltage bushing mounting seats 201, the high-voltage bushings 3, the three-phase separated bus conductors 6, the generator-side three-phase separated bus conductor outer sheaths 7B, the outer sheath shorting plates 8B and 8C, and the expansion joint 9 of this embodiment are similar to those of the conventional design shown in FIG. 1, so an explanation thereof will be omitted.

Figure 5:
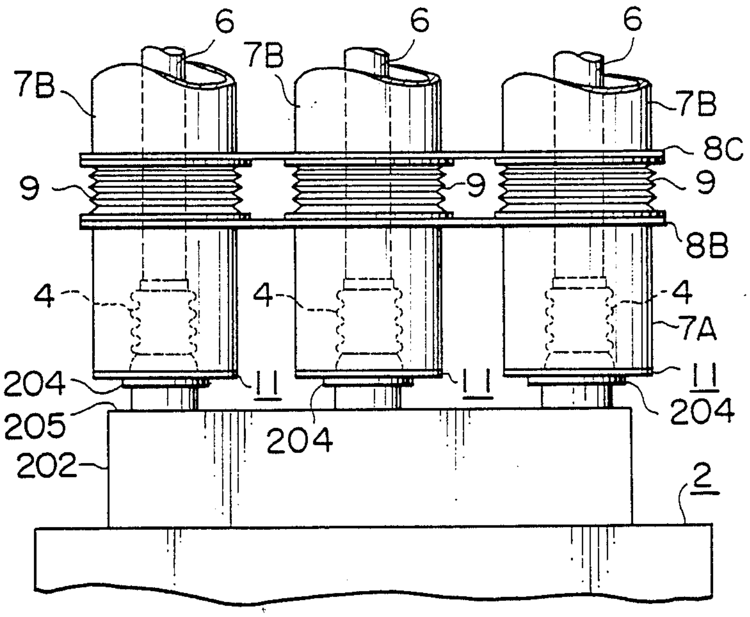
FIG. 5 is a front view of the upper portion of the transformer shown in FIG. 4.

FIG. 5 is a front view of the upper portion of the tank 2 as viewed from the right in FIG. 4. 202 indicates a low-voltage bushing mounting seat which is formed on the tank 2 and which is used in common for three phases. 204 indicates low-voltage bushing mounting flanges formed on an upper plate 205 of the low-voltage bushing mounting seat 202, and 4 indicates low-voltage bushings which are mounted in the low-voltage bushing mounting flanges 204 and which are connected to the low voltage side of the winding 102.

Figure 3:
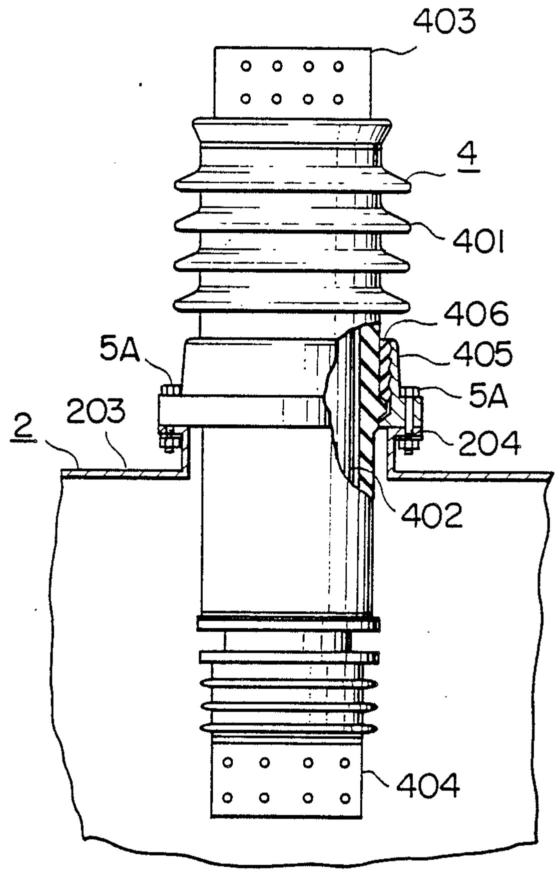
F I G. 3 PRIOR ART
FIG. 3 is a cut-away front view of a low-voltage bushing of the transformer shown in FIG. 1.
Figure 6:
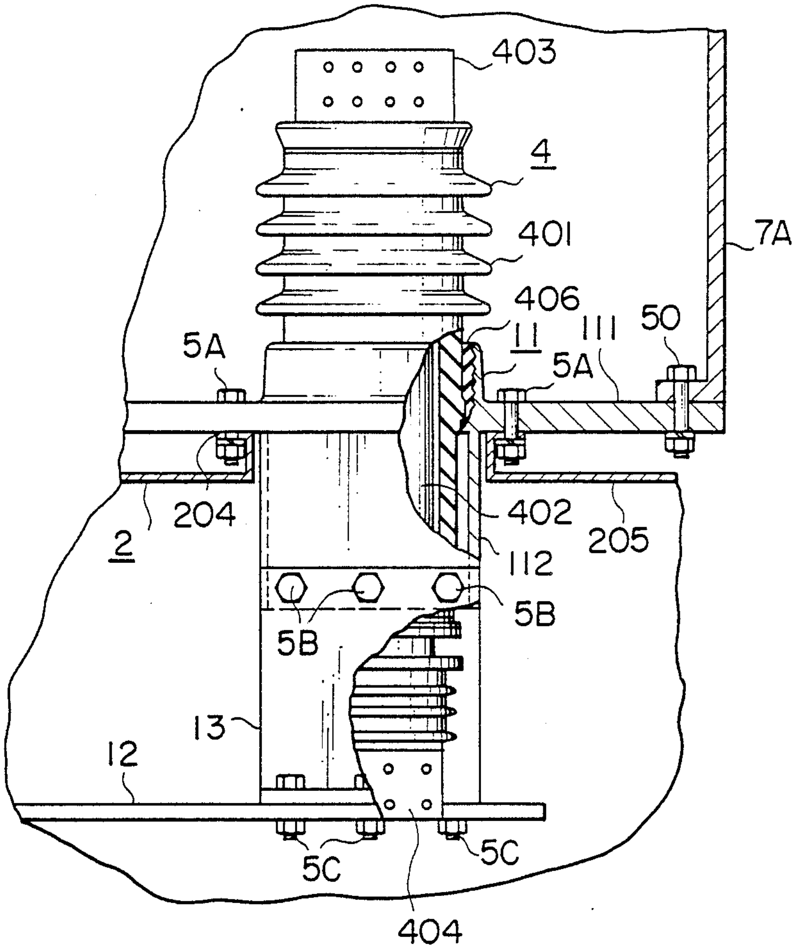
FIG. 6 is a cut-away front view of a low-voltage bushing and the inner shield of the transformer shown in FIG. 4.

FIG. 6 is a cut-away front view of the low-voltage bushing and the inner shield. The insulator tube 401, the central conductor 402, and the upper and the lower terminals 403 and 404 in this figure are similar to those of the conventional design shown in FIG. 3, so an explanation thereof will be omitted.

11 indicates an inner shield which also serves as a mounting unit. It surrounds the insulator tube 401 and is secured to the insulator tube by a bonding agent 406. 111 indicates a flange which is mounted on the low-voltage bushing mounting flange 204 by the bolts 5A. 112 indicates a generally cylindrical tubular member, the bottom end of which has a square cross section of which one side has a length equal to the diameter of the abovementioned cylindrical tubular member 112. This tubular member 112 coaxially surrounds the portion of the low-voltage bushing 4 located inside of the tank 2. The flange 111 and the tubular member 112 are made of a material having a good electrical conductivity such as copper or aluminum, and together constitute the inner shield 11.

12 indicates a flat shorting plate, and 13 indicates connecting conductors attached at their one end to the square bottom end of the tubular member 112 of the inner shield 11 by bolts 5B and attached at their other end to the shorting plate 12 by bolts 5C. The three-phase inner shields 11 are connected to each other by the shorting plate 12. The shorting plate 12 and the connecting conductors 13 are also made of a material having good electrical conductivity. The inner shields 11 and the conducting conductors 13 together shield the portions of the bushings located inside the tank 2.

Figure 7:
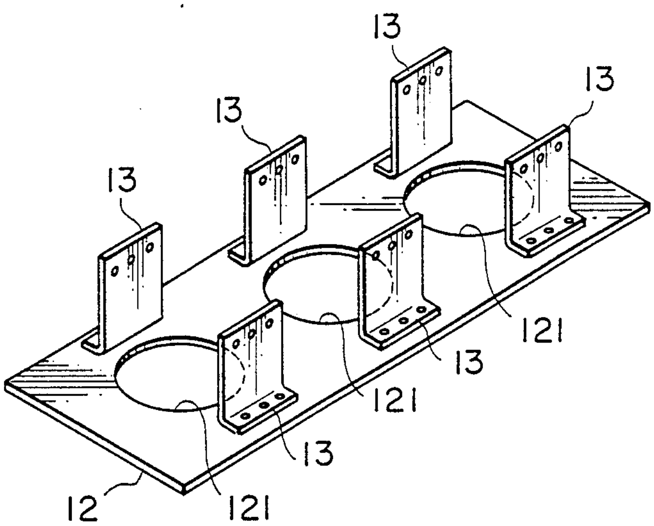
FIG. 7 is a perspective view of an inner shield shorting plate and connecting conductors of the transformer shown in FIG. 4.

FIG. 7 is a perspective view of the shorting plate 12 and the connecting conductors 13. The shorting plate 12 has three circular holes 121 formed therein for the low-voltage bushings 4 so that the connecting conductors from the low-voltage bushings 4 to the winding 102 may extend therethrough. Referring again to FIGS. 4, 5 and 6, 7A indicates transformer-side three-phase separated bus conductor outer sheaths surrounding the portions of the low-voltage bushings 4 located outside of the tank 2 and attached to the flange portion 111 of the inner shields 11 by bolts 50.

The operation will now be described. When a large current flows through the three-phase separated bus conductors 6, the mini-flux structure constructed by the generator-side three-phase separated bus conductor outer sheaths 7B and the outer sheath shorting plate 8C cancels out the magnetic flux. On the transformer-side, a three-phase closed circuit extending into the inside of the tank 2 is formed by the transformer-side three-phase separated bus conductor outer sheaths 7A, the flange portion 111 and the tubular portion 112 of the inner shields 11, the connecting conductors 13, the shorting plate 12, and the outer sheath shorting plate 8B outside of the tank 2. Therefore, the magnetic flux inside of the tank 2 due to the current flowing through the low-voltage bushings 4 is cancelled out by the magnetic flux generated by the current flowing through the inner shields 11. The inner shields 11, the shorting plate 12 and the connecting conductors 13 are made of copper or aluminum, and in this embodiment these elements are immersed within the insulation oil and cooled, so that these elements are not overheated even when a large current flows therethrough. As to the length of the inner shields including the tubular portions 112 of the inner shields 11 and the connecting conductors 13, since the area in which the magnetic flux offset effect of these members extends becomes larger when these elements extend downwards in the figure, it is preferable that the inner shields extend to a position lower than the low-voltage bushing mounting flanges 204 as well as the upper plate 205 of the low-voltage bushing mounting seat 202 which can be easily overheated because they are close to the low-voltage bushings 4.

While the inner shields 11 are indirectly connected to shorting plate 12 through the connecting conductors 13 in the above-described embodiment, the inner shields 11 may be directly connected to the shorting plate 12. Also, while a three-phase example has been shown, similar advantageous results can be obtained in case of a single phase.

As has been described, according to the present invention, the portion of each of the bushings located inside the tank is surrounded by an inner shield, and the inner shields are connected to phase-separated bus conductor outer sheaths on the outside of the tank, while the inner shields are connected inside the tank by a shorting plate. Therefore, a flux structure extends to the inside of the tank, whereby the magnetic flux inside of the tank due to the currents flowing through the bushings is cancelled out by the magnetic flux due to the current flowing through the inner shields, resulting in the advantage that the stray loss is small and the structures around the bushing are not overheated.

What is claimed is:

1. An electrical apparatus comprising:

an electrical device;

a tank containing said electrical device and including a bushing mounting seat which includes an upper plate, the upper plate having a plurality of openings for passage of electrical conductors from outside said tank to said electrical device and a plurality of respective annular bushing mounting flanges, one bushing mounting flange disposed around each opening to form a neck;

a plurality of electrically conducting outer sheaths, each outer sheath mounted to a respective one of the bushing mounting flanges outside said tank;

an outer sheath shorting plate connected between said outer sheaths;

a plurality of inner shields respectively disposed on the openings of the upper plate, each inner shield including a flange mounted on the annular bushing mounting flange and a generally cylindrical tubular member extending through the neck of the bushing mounting flange into said tank at lower ends thereof; and a shorting plate disposed inside said tank having a first face facing the upper plate and having a plurality of holes respectively aligned with the openings of the upper plate, said shorting plate having a plurality of pairs of connecting conductors mounted on the first face thereof, each pair being adjacent to a respective one of the holes, each pair including two connecting conductors having lower ends mounted to opposite sides of the respective hole on the first face and having upper ends electrically connected to the lower ends of the inner shields projecting within said tank from the necks of the respective openings of the upper plate;

wherein said outer sheaths, the flanges and tubular members of said inner shields, the connecting conductors of said shorting plate, said shorting plate, and said outer sheath shorting plate form a three-phase closed circuit.

* * * * *